(12) United States Patent
Cok (10) Patent No.: US 6,879,319 B2
(45) Date of Patent: Apr. 12, 2005

(54) INTEGRATED OLED DISPLAY AND TOUCH SCREEN

(75) Inventor: Ronald S. Cok, Rochester, NY (US)

(73) Assignee: Eastman Kodak Company, Rochester, NY (US)

(*) Notice: Subject to any disclaimer, the term of this patent is extended or adjusted under 35 U.S.C. 154(b) by 355 days.

(21) Appl. No.: 10/280,212

(22) Filed: Oct. 25, 2002

(65) Prior Publication Data

US 2004/0080267 A1 Apr. 29, 2004

(51) Int. Cl.[7] .................................................. G09G 5/00
(52) U.S. Cl. ....................................... 345/173; 345/76
(58) Field of Search ............................... 345/173–178, 345/76–83, 107; 178/18.01, 18.03; 359/296; 257/100; 438/99, 455; 204/192.29

(56) References Cited

U.S. PATENT DOCUMENTS

| | | | |
|---|---|---|---|
| 5,795,430 A | 8/1998 | Beeteson et al. | |
| 6,424,094 B1 | 7/2002 | Feldman | |
| 2002/0171610 A1 * | 11/2002 | Siwinski et al. | 345/76 |
| 2002/0186208 A1 * | 12/2002 | Feldman et al. | 345/173 |
| 2002/0186209 A1 * | 12/2002 | Cok | 345/173 |
| 2003/0064540 A1 * | 4/2003 | Auch et al. | 438/99 |
| 2003/0150714 A1 * | 8/2003 | Cropper et al. | 204/192.29 |

* cited by examiner

*Primary Examiner*—Regina Lang
(74) *Attorney, Agent, or Firm*—Thomas H. Close (57) ABSTRACT

An integrated OLED display and touch screen is made by the steps of: providing a substrate; forming a top-emitting OLED display on the substrate, the display including light blocking circuit elements extending to an edge of the substrate; providing a transparent encapsulating cover; forming a touch screen on a first side of the transparent encapsulating cover, the touch screen having light blocking circuit elements extending to a corresponding edge of the transparent encapsulating cover; locating the encapsulating cover over the substrate with a light curable adhesive located between the light blocking circuit elements of the display and the touch screen; and curing the light curable adhesive to hermetically encapsulate the OLED display.

17 Claims, 4 Drawing Sheets

INTEGRATED OLED DISPLAY AND TOUCH SCREEN

FIELD OF THE INVENTION

The present invention relates to an organic light emitting diode (OLED) display device integrated with a touch screen and related manufacturing method.

BACKGROUND OF THE INVENTION

Electronic devices typically include a computing engine, a display, and an interactive device responsive to the input of a user. For example, a computer may include a computing circuit, a CRT for display, and a keyboard and mouse responsive to a user's input. As a second example, a Personal Digital Assistant includes a computing circuit, an LCD display, and a touch screen formed over the LCD display, together with some buttons. Many electronic devices, in particular mobile devices, miniature devices, devices that require a re-programmable interface, or devices that require a robust and simple user interaction mechanism rely upon touch screens placed over a display to provide user interaction capabilities to the device.

There are many touch screen technologies such as resistive wire, acoustic, and infra-red. These are generally placed above either a CRT screen or LCD screen to provide the required interactive functionality in a single component composed of two parts. Typically, the display (for example, LCD or CRT) is manufactured while the touch screen is made separately. After the display and touch screen are manufactured, they are integrated in a common housing to provide a single component that can be built into a complete electronic device.

Resistive wire touch screens are built upon a substrate that is coated with a resistive film, typically indium tin oxide (ITO) at a specified thickness, uniformity and resistivity. Other resistive touch screen materials, such as spacer dots, conductive films, etc., are carefully formed upon the coated substrate to create a resistive touch screen. When conventionally combined with a display, the multi-layer component has inferior optical characteristics to the display device alone due to inter-layer reflections, has redundant manufacturing steps, and redundant components. Moreover, the additional step of integrating the components raises manufacturing costs for the complete device. The manufacturing processes for display-and-touch-screen devices are well known in the art and products are available today from a variety of vendors. For example, U.S. Pat. No. 5,795,430 issued Aug. 18, 1998 to Beeteson et al., describes an adhesive material dispensed onto a faceplate and used to attach a touch screen.

A new class of display devices based upon organic light-emitting diodes (OLEDs) is formed by depositing patterned conductive and organic materials upon a substrate. This substrate can be identical to the substrate used for resistive wire touch screens. Moreover, the materials used for the patterned conductive materials are similar to, or the same as, those used for the resistive films, but their uniformity, thickness and resistivity may vary. The OLED displays are made by patterning a conductive material that is formed on a substrate. For an OLED display, the conductive material is ideally a low resistivity film, whereas for a touch screen substrate a controlled higher resistivity film is employed. If an active-matrix display device is desired, electronic components such as transistors and capacitors are also formed on the patterned conductive material in a desired circuit design. Once the conductive pattern and electronic components are formed, organic materials are deposited, followed by any remaining conductive elements, planarization layers, and other layers as known in the prior art. The organic materials are sensitive to and degraded by moisture, heat, and ultra-violet radiation. Connecting pads are defined as part of the conducting pattern and are wire-bonded to a cable after the device is encapsulated. The process by which the OLED display device is made uses well-known photolithographic, deposition, bonding, and encapsulation methods commonplace in the integrated circuit industry.

However, a problem exists with the conventional practice of forming separate OLED displays and touch screens and then combining them, in that the additional layers in the touch screen reduce the brightness of the display, reduces the optical quality of the display due to additional internal reflections from the layers of the touch screen, and add cost due to the need for two substrates and a complex housing for the two elements. U.S. Pat. No. 6,424,094 B1 issued Jul. 23, 2002 to Feldman addresses this problem for a bottom-emitter OLED display (one viewed through the substrate) but the proposed solution may not be applicable to a top-emitter display (one viewed through the cover).

Although epoxy adhesives are used for bonding covers to substrates, methods of adhesive application are problematic for use with OLED materials since commonly-used epoxies require either ultra-violet radiation and/or heat to cure, both of which can degrade the organic materials in the OLED display. Moreover, a conventional application of adhesive material and curing as taught, for example, in U.S. Pat. No. 5,795,430 (cited above) is problematic in that the circuit elements including silver inks used on the edges of resistive-wire touch screens obscure the adhesive material beneath the inks. Adhesives are known that cure in shadowed areas not directly exposed to curing radiation, for example Appli-Tec 6202, but these require a secondary heating process to complete the cure that can destroy the OLED materials. Other known adhesives that are not light curable lack the necessary properties required to form a hermetic seal for the OLED materials, or require excessive heat for curing.

Other types of touch screens, such as those employing surface acoustic wave, capacitive and inductive technologies also include light blocking circuit elements that extend to the edges of the touch screen and may obscure the light curing of a light curing adhesive material.

There is a need therefore for an improved integrated resistive touch screen and top-emitter OLED display that reduces redundant components in the devices, reduces cost, improves optical qualities, and is more robust and a manufacturing method therefore.

SUMMARY OF THE INVENTION

The need is met according to the present invention by making an integrated OLED display and touch screen by the steps of: providing a substrate; forming a top-emitting OLED display on the substrate, the display including light blocking circuit elements extending to an edge of the substrate; providing a transparent encapsulating cover; forming a touch screen on a first side of the transparent encapsulating cover, the touch screen having light blocking circuit elements extending to a corresponding edge of the transparent encapsulating cover; locating the encapsulating cover over the substrate with a light curable adhesive located between the light blocking circuit elements of the display and the touch screen; and curing the light curable adhesive to hermetically encapsulate the OLED display.

ADVANTAGES

The present invention has the advantage that it reduces the number of components required to build an integrated OLED display and resistive touch screen device, reduces the number of manufacturing steps, reduces the manufacturing costs, reduces the combined size of the display and touch screen device, and provides superior optical performance.

DETAILED DESCRIPTION OF THE INVENTION

Figure 1:
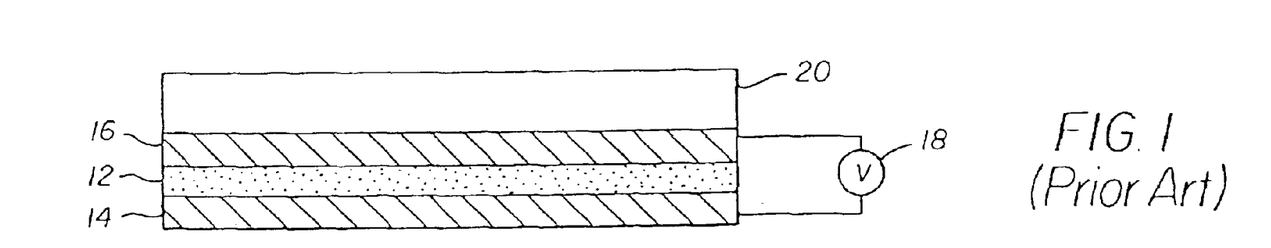
FIG. 1 illustrates a partial cross section of a prior-art conventional OLED.

Referring to FIG. 1, a prior art OLED includes an organic light-emitting layer 12 disposed between two electrodes 14 and 16, e.g. a cathode and an anode. The organic light emitting layer 12 emits light upon application of a voltage from a power source 18 across the electrodes. The OLED 10 typically includes a substrate 20 such as glass or plastic. It will be understood that the relative locations of the anode and cathode may be reversed with respect to the substrate. The light-emitting layer 12 may include other layers such as electron or hole injection layers as is known in the art.

Figure 2:
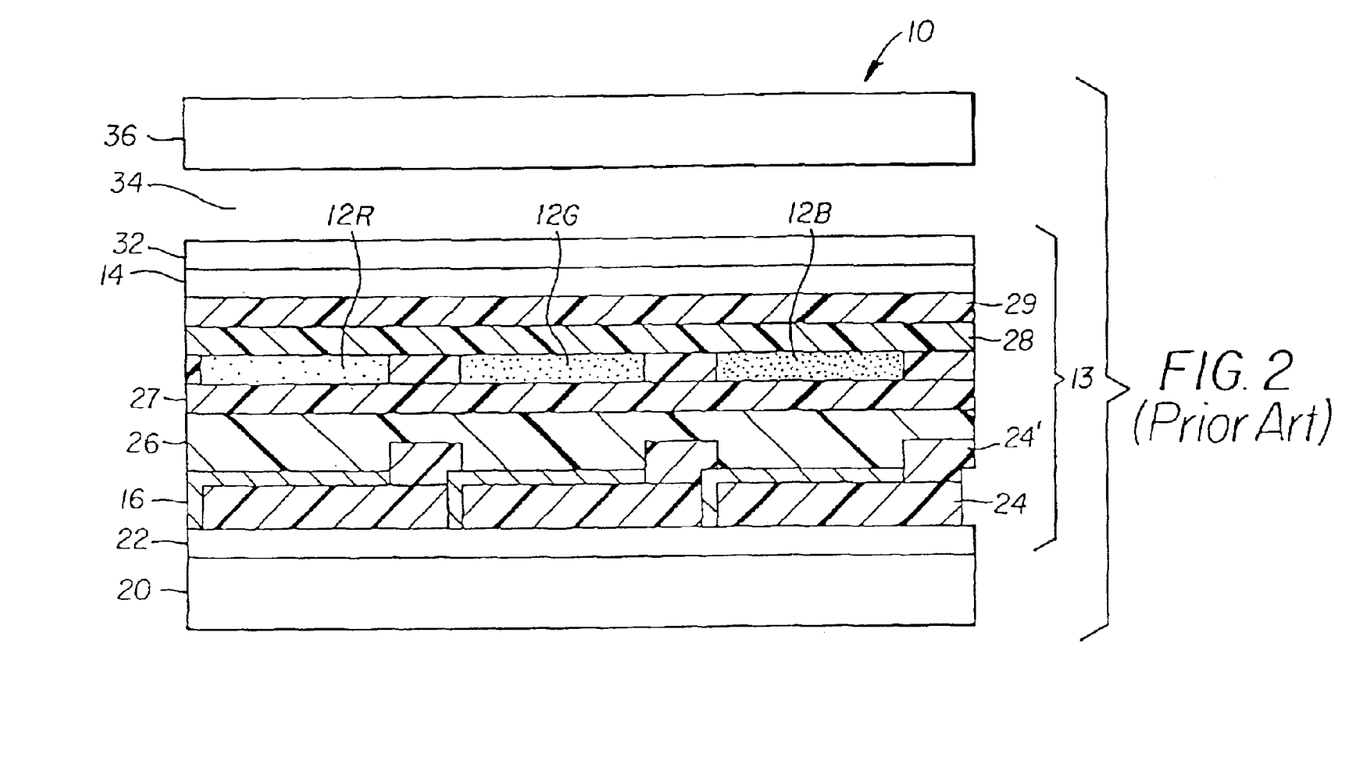
FIG. 2 illustrates a partial cross section of a prior-art conventional top-emitting OLED display device.

Referring to FIG. 2, a prior art top-emitting OLED display device 10 includes a substrate 20, upon which is formed a thin-film transistor (TFT) active matrix layer 22 that provide power to an OLED light emitting layer. A patterned first planarizing insulating layer 24 is provided over the TFT active matrix layer, and an array of first electrodes 16 are provided over the planarized insulating layer 24 and in electrical contact with the TFT active matrix layer. A patterned second insulating layer 24' is provided over the array of first electrodes 16 such that at least a portion of the each of the first electrodes 16 is exposed and the various electrodes 16 do not form an electrical short circuit.

Over the first electrodes and insulating layers are provided red, green, and blue-emitting organic OLED elements, 12R, 12G, and 12B, respectively. These elements are composed of further layers as described in more detail below. Herein, the collection of OLED elements 13, including hole injection 26, hole transport 27, electron injection 29, and electron transport layers 28, may also be referred to as the OLED light-emitting layer 12. The light-emitting area is generally defined by the area of the first electrode 16 in contact with the OLED elements. Over the OLED light-emitting layer 12 is provided a transparent, common second electrode 14 that has sufficient optical transparency to allow transmission of the generated red, green, and blue light. An optional second electrode protection layer 32 may be provided to protect the electrode and underlying layers. Each first electrode in combination with its associated OLED element and second electrode is herein referred to as an OLED. A typical top-emitting OLED display device comprises an array of OLEDs wherein each OLED emits red, green or blue. A gap 34 generally filled with inert gas or a transmissive polymer material separates the optional electrode protection layer from an encapsulating cover 36. Alternatively, the encapsulating cover 36 may only be necessary for physical protection if the optional second electrode protection 32 layer provides adequate encapsulation.

Figure 3:
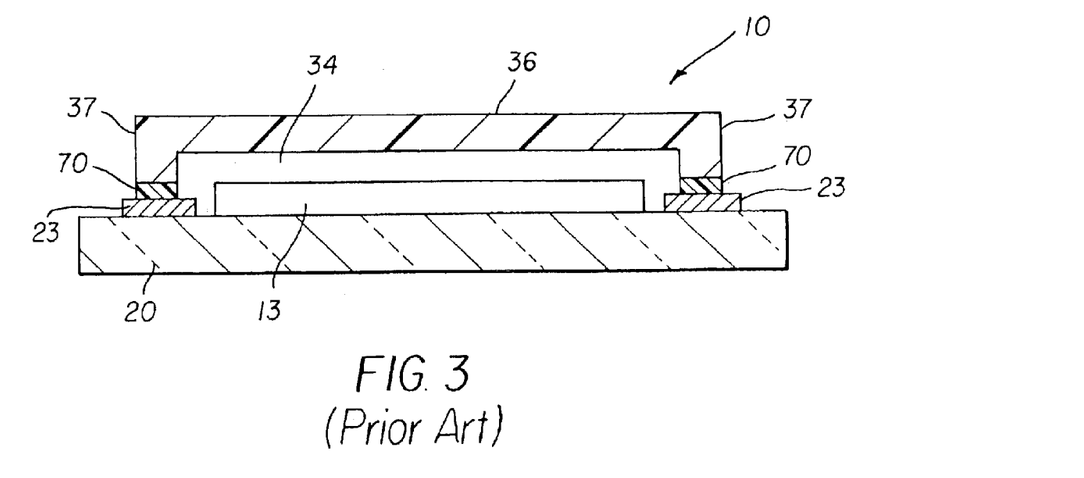
FIG. 3 is a prior art schematic diagram illustrating a top-emitting OLED display, showing light blocking circuit elements around the periphery of the display.

Referring to FIG. 3, the top emitting OLED display device 10 includes light blocking circuitry 23 such as drivers and signal and power connections around the edges of the substrate 20. The encapsulating cover 36 is hermetically adhered to the substrate with light curable adhesive 70. The adhesive 70 is located above the light blocking circuitry 23 and is cured by directing light through the encapsulating cover 36. The encapsulating cover 36 is shown as defining a cavity over the OLED area with a rim 37 around the perimeter of the cover. The edge of the rim 37 is shown adhered to the substrate. Alternatively, the encapsulating cover 36 may be a flat sheet that does not define a cavity, and the adhesive around the perimeter forms the hermetic seal.

Figure 4:
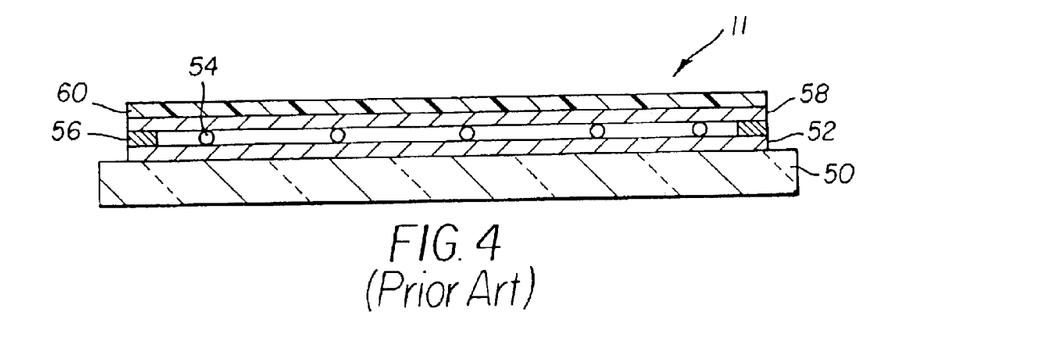
FIG. 4 is a cross section of a prior-art resistive touch screen.

Referring to FIG. 4, a prior-art resistive touch screen 11 includes a substrate 50 coated with a transparent, uniformly-resistive layer 52. Located upon the layer 52 are transparent spacer dots 54, made for example of polymer spheres. Light blocking circuit elements such as conductive sensors 56 and/or field correction conductors, typically made of opaque silver inks, are located at the edge of the touch screen 11. A flexible top layer 60 coated with a conductive material 58 is located above the substrate 50 and separated from it by the spacer dots 54. The layers 52 and 58 are provided with a voltage differential and plurality of conductive sensors and connections 56 to the resistive layer 52.

In operation, the flexible top layer 60 is deformed by a stylus or finger, causing the conductive layer 58 to contact the resistive layer 52 and a current to flow. The current is measured through the sensors and conductors 56 and used to calculate the location of the deformation. This arrangement is fundamentally the same for both four-wire touch screens (for which four sensor wires are used) and five-wire touch screens (for which five sensor wires are used). The four- and five-wire designs differ in the shape and number of sensors but both use opaque sensors and conductors 56 deposited at the edge of the substrate 50.

In the four-wire design, the conductive sensor connections 56 are conductive connections located along opposite edges of the resistive layer 52 and conductive layer 58; while in the five-wire design the sensors and conductors 56 includes both field-correction conductors on each edge of the resistive layer 52 and conductive sensor connections at the corners and to the conductive layer 58. Opaque conductive materials, typically silver inks, are used for the sensor and/or field correction sensors and conductors 56 in either case.

Figure 5:
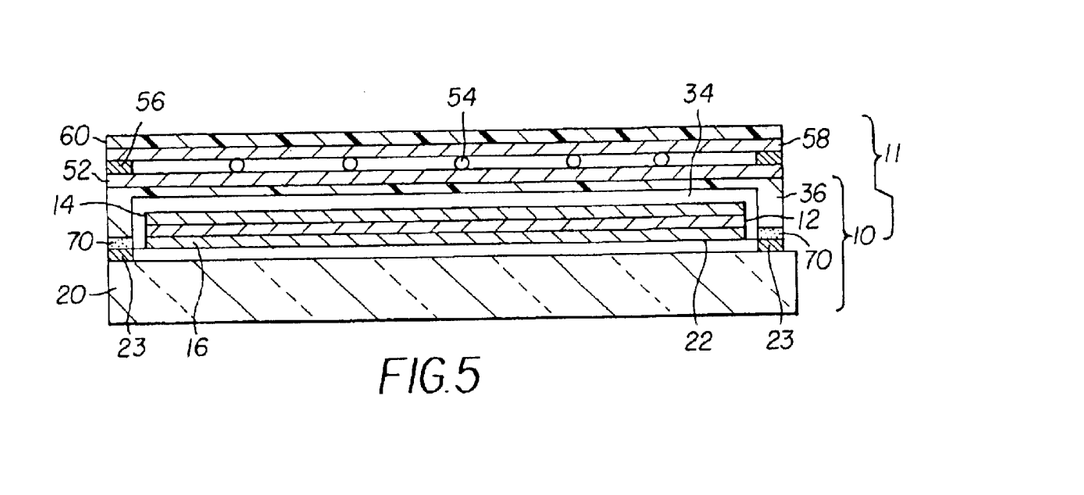
FIG. 5 is a cross section of an integrated OLED display device and touch screen made according to one embodiment of the present invention.

Referring to FIG. 5, one embodiment of the present invention is shown. A top-emitter OLED display device includes a substrate 20, drivers 23 located at the periphery of the substrate, thin-film transistors (TFTs) 22, an electrode 16, an organic light-emitting layer 12, a second electrode 14, and an encapsulating cover 36. The organic light-emitting layer 12 includes the layers 26, 27, 28, 29, and 12 and omits the optional second electrode protection layer 32 shown in FIG. 2. A resistive-wire touch screen is constructed upon the encapsulating cover 36 and includes the resistive layer 52, spacer dots 54, conductive sensors and conductors 56, flexible top layer 60, and the conductive layer 58. The encapsulating cover 36 is affixed to the substrate 20 with a light curable adhesive 70 located around the perimeter of the cover and outside the active area of the display. As shown, the light curable adhesive is located between the light blocking circuit elements (i.e. drivers 23 and conductors 56 of the display and the touch screen, respectively. The adhesive may be transparent or may be light absorbing after it is cured since it is located around the periphery of the active display area of the display and does not occlude the light emitted by the display.

In operation, current and control signals are supplied to the OLED light-emitting layer 12 through the drivers 23, TFTs 22, and electrodes 16 and 14, causing the OLED light-emitting layer 12 to emit light. An operator views the display and interacts with the information presented on the display by deforming the flexible layer 60 with a finger or stylus causing a current to flow between the conductive layer 58 and resistive layer 52. The current is sensed through the conductive sensor connections 56 and the interaction is complete.

The present invention provides a highly integrated, interactive display device using fewer components and providing improved optical performance than conventional designs. Fewer components are required because the substrate 50 is incorporated into the encapsulating cover 36. This further improves the optical quality of the system because the light emitted from the display device has fewer layers to travel through.

The encapsulating cover 36 can be flat or structured to define a cavity 34 between the inside of the cover 36 and the second electrode 14. This cavity 34 can be used to improve the display, for example by including transparent materials to increase the strength of the assembly or by including desiccant materials to protect the OLED light-emitting layer 12 from moisture, thereby improving the lifetime of the display.

Light curable epoxy adhesives are the conventional materials chosen to adhere the cover 36 to the substrate 20. These adhesives provide great strength and encapsulative properties, thus excluding moisture from the OLED light-emitting layer 12. However, existing epoxy materials providing suitable strength and encapsulation are cured by exposure to ultra-violet radiation through the cover 36 or substrate 20 and/or through heat. Both heat and ultra-violet radiation are detrimental to the OLED materials, particularly at the levels necessary for adequate curing of the epoxy materials (temperatures in excess of 100 degrees Celsius). Moreover, exposure of the adhesive material 70 through the substrate 20 and/or cover 36 is problematic in that the adhesive material 70 is obscured by the light blocking elements including the drivers 23 on the substrate and the silver inks comprising the sensors and conductors 56 on the touch screen.

Epoxy materials are available that can cure "shadowed" areas obscured by features on the substrate or cover. However, in the present invention the cover is typically less than 1 mm in thickness and both the drivers 23 and the silver inks of the sensors 56 are typically more than 2.5 mm wide, thus creating a significant shadowed area. Moreover, such epoxies that can be cured in shadowed areas are typically cured in two sequential stages, first through ultra-violet exposure and then through heat. The heat curing stage can destroy the OLED materials, often reaching 140 degrees Celsius. The present invention provides an alternative means of curing the adhesives that are shadowed by the light blocking circuit elements such that a two stage cured epoxy is not required.

Figure 6:
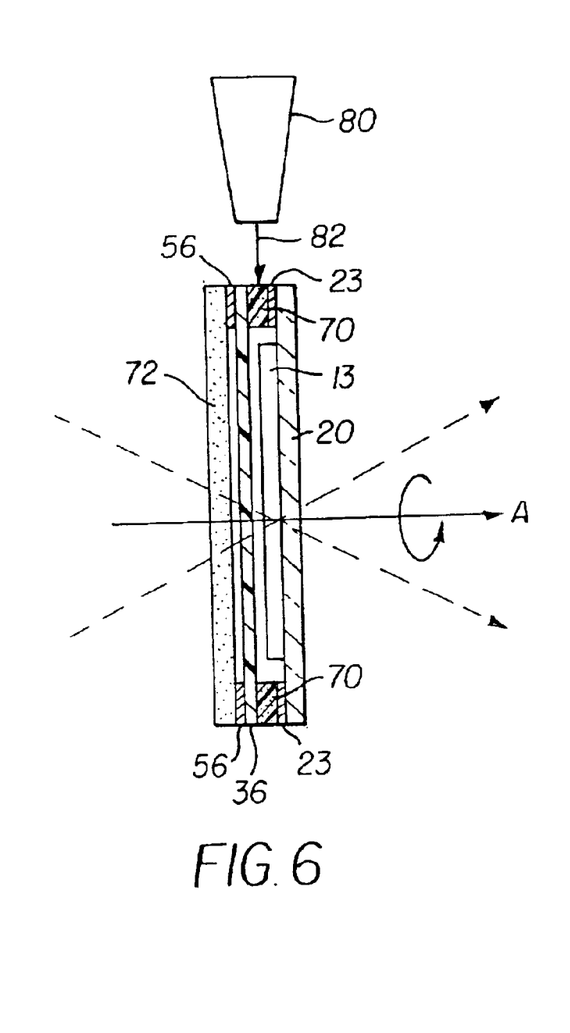
FIG. 6 is a schematic diagram illustrating the step of curing the light curable adhesive according to one embodiment of the present invention.

According to the present invention, the encapsulating cover 36 may be bonded to the substrate 20 by exposing an applied ultra-violet curable epoxy through the edge of the integrated display. Referring to FIG. 6, a side view of the integrated touch screen and display is shown with the cover 36, adhesive 70, and substrate 20. An ultra-violet light source 80 provides ultra-violet radiation 82 directed through the edge of the transparent cover to the adhesive 70. The depth of the seal (>several mm) is greater than the conventional thickness of the cover or substrate (typically <1 mm). However, the light curable epoxy is cured by increasing the level of radiation. Epoxy materials are commercially available that can be cured beneath more than 1 cm of glass or epoxy.

Because the radiation is directed to the edges of the display device parallel to the substrate, the radiation does not impinge directly on the OLED materials on the substrate, thereby avoiding degrading the OLED material. Moreover, by providing a light-absorbing mask 72 on the outside of the touch screen, stray radiation may be absorbed, further protecting the OLED materials. In order to maximize the exposure of ultra-violet radiation to the adhesive material, it is helpful to rotate the integrated display on edge about an axis A perpendicular to the surface of the display, bringing each portion of each edge close to a radiation source 80. Alternatively, the radiation source 80 may be moved around the edge of the display or multiple sources may be used. Furthermore, the axis A of rotation may be precessed as shown by the dashed lines in FIG. 6 to further improve the exposure of the epoxy to the curing light. If the substrate 20 is transparent, a mask may also be located over the substrate side of the display during exposure to protect the OLED materials during curing of the light curable adhesive.

Figure 7:
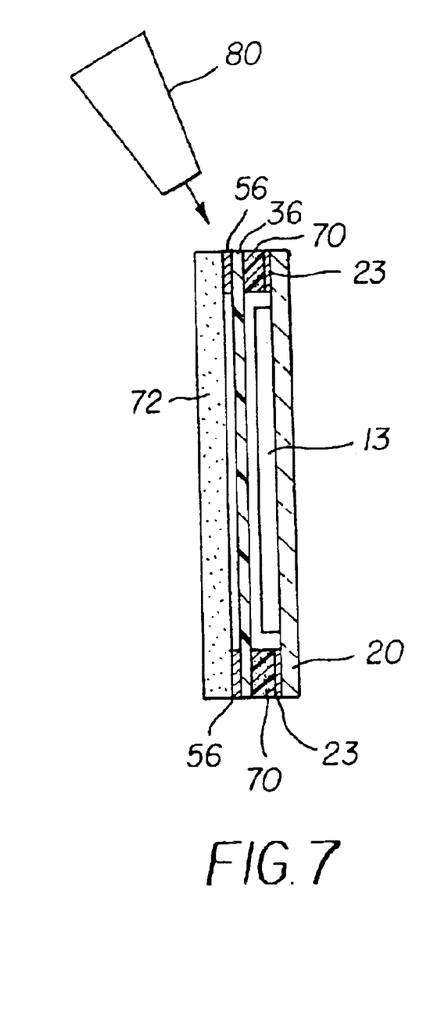
FIG. 7 is a schematic diagram illustrating an alternative arrangement for curing the light curable adhesive.

Referring to FIG. 7, alternatively, the light source may be arranged at an angle to the surface of the substrate. If the relative thickness of the cover and/or substrate is larger and the width of the obscuring opaque feature is smaller, then the adhesive may be cured through exposure to ultra-violet radiation by tilting the display relative to the ultra-violet light source and exposing the adhesive material from either side. In this case, the edge area must be larger to accommodate a light-absorbing plate or the OLED light-emitting layer may be exposed.

Figure 8:
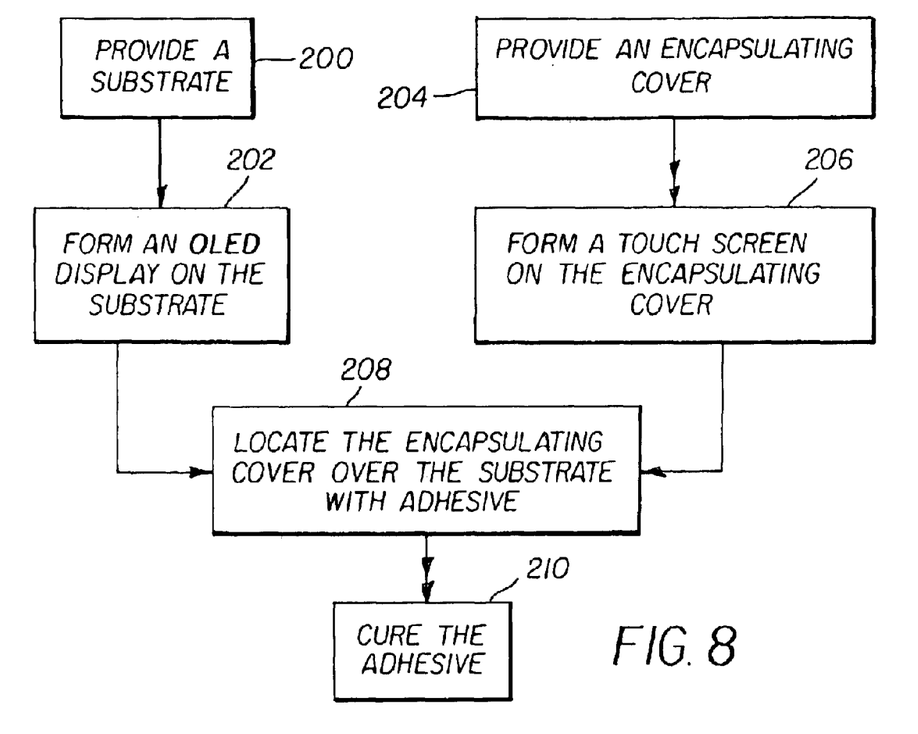
FIG. 8 is a flow chart illustrating the steps of making an integrated OLED display device and touch screen according to the present invention.

Referring to FIG. 8, an integrated OLED display device and touch screen is made by providing 200 a substrate and forming 202 an OLED display on the substrate. An encapsulating cover is provided 204 and a touch screen is formed 206 on the encapsulating cover. The encapsulating cover is located 208 over the substrate, with a light curable adhesive located between the encapsulating cover and the substrate. The adhesive is cured 210 by directing light onto the edge of the display to hermetically encapsulate the OLED display.

General Device Architecture

The present invention can be employed in most OLED device configurations. These include very simple structures comprising a single anode and cathode to more complex devices, such as passive matrix displays comprised of orthogonal arrays of anodes and cathodes to form pixels, and active-matrix displays where each pixel is controlled independently, for example, with thin film transistors (TFTs).

Figure 9:
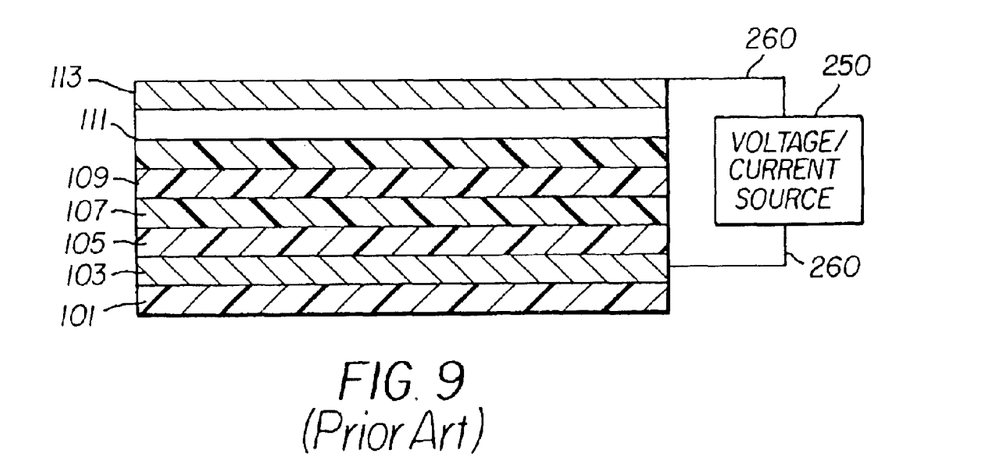
FIG. 9 is a partial cross section of a prior art OLED having multiple layers.

There are numerous configurations of the organic layers wherein the present invention can be successfully practiced. A typical structure is shown in FIG. 9 and is comprised of a substrate 101, an anode 103, a hole-injecting layer 105, a hole-transporting layer 107, a light-emitting layer 109, an electron-transporting layer 111, and a cathode 113. These layers are described in detail below. Note that the substrate may alternatively be located adjacent to the cathode, or the substrate may actually constitute the anode or cathode. The organic layers between the anode and cathode are conveniently referred to as the organic EL element. The total combined thickness of the organic layers is preferably less than 500 nm.

The anode and cathode of the OLED are connected to a voltage/current source 250 through electrical conductors 260. The OLED is operated by applying a potential between the anode and cathode such that the anode is at a more positive potential than the cathode. Holes are injected into the organic EL element from the anode and electrons are injected into the organic EL element at the anode. Enhanced device stability can sometimes be achieved when the OLED is operated in an AC mode where, for some time period in the cycle, the potential bias is reversed and no current flows. An example of an AC driven OLED is described in U.S. Pat. No. 5,552,678.

Substrate

The OLED device of this invention is typically provided over a supporting substrate where either the cathode or anode can be in contact with the substrate. The electrode in contact with the substrate is conveniently referred to as the bottom electrode. Conventionally, the bottom electrode is the anode, but this invention is not limited to that configuration. The substrate can either be transmissive or opaque. In the case wherein the substrate is transmissive, I reflective or light absorbing layer is used to reflect the light through the cover or to absorb the light, thereby improving the contrast of the display. Substrates can include, but are not limited to, glass, plastic, semiconductor materials, silicon, ceramics, and circuit board materials. Of course it is necessary to provide a light-transparent top electrode.

Anode

When EL emission is viewed through anode 103, the anode should be transparent or substantially transparent to the emission of interest. Common transparent anode materials used in this invention are indium-tin oxide (ITO), indium-zinc oxide (IZO) and tin oxide, but other metal oxides can work including, but not limited to, aluminum- or indium-doped zinc oxide, magnesium-indium oxide, and nickel-tungsten oxide. In addition to these oxides, metal nitrides, such as gallium nitride, and metal selenides, such as zinc selenide, and metal sulfides, such as zinc sulfide, can be used as the anode. For applications where EL emission is viewed only through the cathode electrode, the transmissive characteristics of anode are immaterial and any conductive material can be used, transparent, opaque or reflective. Example conductors for this application include, but are not limited to, gold, iridium, molybdenum, palladium, and platinum. Typical anode materials, transmissive or otherwise, have a work function of 4.1 eV or greater. Desired anode materials are commonly deposited by any suitable means such as evaporation, sputtering, chemical vapor deposition, or electrochemical means. Anodes can be patterned using well-known photolithographic processes. Optionally, anodes may be polished prior to application of other layers to reduce surface roughness so as to minimize shorts or enhance reflectivity.

Hole-Injecting Layer (HIL)

While not always necessary, it is often useful to provide a hole-injecting layer 105 between anode 103 and hole-transporting layer 107. The hole-injecting material can serve to improve the film formation property of subsequent organic layers and to facilitate injection of holes into the hole-transporting layer. Suitable materials for use in the hole-injecting layer include, but are not limited to, porphyrinic compounds as described in U.S. Pat. No. 4,720,432, plasma-deposited fluorocarbon polymers as described in U.S. Pat. No. 6,208,075, and some aromatic amines, for example, m-MTDATA (4,4',4"-tris[(3-methylphenyl)phenylamino]triphenylamine). Alternative hole-injecting materials reportedly useful in organic EL devices are described in EP 0 891 121 A1 and EP 1 029 909 A1.

Hole-Transporting Layer (HTL)

The hole-transporting layer 107 contains at least one hole-transporting compound such as an aromatic tertiary amine, where the latter is understood to be a compound containing at least one trivalent nitrogen atom that is bonded only to carbon atoms, at least one of which is a member of an aromatic ring. In one form the aromatic tertiary amine can be an arylamine, such as a monoarylamine, diarylamine, triarylamine, or a polymeric arylamine. Exemplary monomeric triarylamines are illustrated by Klupfel et al. U.S. Pat. No. 3,180,730. Other suitable triarylamines substituted with one or more vinyl radicals and/or comprising at least one active hydrogen containing group are disclosed by Brantley et al. in U.S. Pat. Nos. 3,567,450 and 3,658,520.

A more preferred class of aromatic tertiary amines are those which include at least two aromatic tertiary amine moieties as described in U.S. Pat. Nos. 4,720,432 and 5,061,569. The hole-transporting layer can be formed of a single or a mixture of aromatic tertiary amine compounds. Illustrative of useful aromatic tertiary amines are the following:

1,1-Bis(4-di-p-tolylaminophenyl)cyclohexane
1,1-Bis(4-di-p-tolylaminophenyl)-4-phenylcyclohexane
4,4'-Bis(diphenylamino)quadriphenyl
Bis(4-dimethylamino-2-methylphenyl)-phenylmethane
N,N,N-Tri(p-tolyl)amine
4-(di-p-tolylamino)-4'-[4(di-p-tolylamino)-styryl]stilbene
N,N,N',N'-Tetra-p-tolyl-4-4'-diaminobiphenyl
N,N,N',N'-Tetraphenyl-4,4'-diaminobiphenyl
N,N,N',N'-tetra-1-naphthyl-4,4'-diaminobiphenyl
N,N,N',N'-tetra-2-naphthyl-4,4'-diaminobiphenyl
N-Phenylcarbazole
4,4'-Bis[N-(1-naphthyl)-N-phenylamino]biphenyl
4,4'-Bis[N-(1-naphthyl)-N-(2-naphthyl)amino]biphenyl
4,4"-Bis[N-(1-naphthyl)-N-phenylamino]p-terphenyl
4,4'-Bis[N-(2-naphthyl)-N-phenylamino]biphenyl
4,4'-Bis[N-(3-acenaphthenyl)-N-phenylamino]biphenyl
1,5-Bis[N-(1-naphthyl)-N-phenylamino]naphthalene
4,4'-Bis[N-(9-anthryl)-N-phenylamino]biphenyl
4,4"-Bis[N-(1-anthryl)-N-phenylamino]-p-terphenyl
4,4'-Bis[N-(2-phenanthryl)-N-phenylamino]biphenyl
4,4'-Bis[N-(8-fluoranthenyl)-N-phenylamino]biphenyl
4,4'-Bis[N-(2-pyrenyl)-N-phenylamino]biphenyl
4,4'-Bis[N-(2-naphthacenyl)-N-phenylamino]biphenyl
4,4'-Bis[N-(2-perylenyl)-N-phenylamino]biphenyl
4,4'-Bis[N-(1-coronenyl)-N-phenylamino]biphenyl
2,6-Bis(di-p-tolylamino)naphthalene
2,6-Bis[di-(1-naphthyl)amino]naphthalene
2,6-Bis[N-(1-naphthyl)-N-(2-naphthyl)amino]naphthalene N,N,N',N'-Tetra(2-naphthyl)-4,4'''-diamino-p-terphenyl
4,4'-Bis{N-phenyl-N-[4-(1-naphthyl)-phenyl]amino}biphenyl
4,4'-Bis[N-phenyl-N-(2-pyrenyl)amino]biphenyl
2,6-Bis[N,N-di(2-naphthyl)amine]fluorene
1,5-Bis[N-(1-naphthyl)-N-phenylamino]naphthalene
4,4',4"-tris[(3-methylphenyl)phenylamino]triphenylamine Another class of useful hole-transporting materials includes polycyclic aromatic compounds as described in EP 1 009 041. Tertiary aromatic amines with more than two amine groups may be used including oligomeric materials. In addition, polymeric hole-transporting materials can be used such as poly(N-vinylcarbazole) (PVK), polythiophenes, polypyrrole, polyaniline, and copolymers such as poly(3,4-ethylenedioxythiophene)/poly(4-styrenesulfonate) also called PEDOT/PSS.

Light-Emitting Layer (LEL)

As more fully described in U.S. Pat. Nos. 4,769,292 and 5,935,721, the light-emitting layer (LEL) 109 of the organic EL element includes a luminescent or fluorescent material where electroluminescence is produced as a result of electron-hole pair recombination in this region. The light-emitting layer can be comprised of a single material, but more commonly consists of a host material doped with a guest compound or compounds where light emission comes primarily from the dopant and can be of any color. The host materials in the light-emitting layer can be an electron-transporting material, as defined below, a hole-transporting material, as defined above, or another material or combination of materials that support hole-electron recombination. The dopant is usually chosen from highly fluorescent dyes, but phosphorescent compounds, e.g., transition metal complexes as described in WO 98/55561, WO 00/18851, WO 00/57676, and WO 00/70655 are also useful. Dopants are typically coated as 0.01 to 10% by weight into the host material. Polymeric materials such as polyfluorenes and polyvinylarylenes (e.g., poly(p-phenylenevinylene), PPV) can also be used as the host material. In this case, small molecule dopants can be molecularly dispersed into the polymeric host, or the dopant could be added by copolymerizing a minor constituent into the host polymer.

An important relationship for choosing a dye as a dopant is a comparison of the bandgap potential which is defined as the energy difference between the highest occupied molecular orbital and the lowest unoccupied molecular orbital of the molecule. For efficient energy transfer from the host to the dopant molecule, a necessary condition is that the band gap of the dopant is smaller than that of the host material. For phosphorescent emitters it is also important that the host triplet energy level of the host be high enough to enable energy transfer from host to dopant.

Host and emitting molecules known to be of use include, but are not limited to, those disclosed in U.S. Pat. Nos. 4,768,292; 5,141,671; 5,150,006; 5,151,629; 5,405,709; 5,484,922; 5,593,788; 5,645,948; 5,683,823; 5,755,999; 5,928,802; 5,935,720; 5,935,721; and 6,020,078.

Metal complexes of 8-hydroxyquinoline (oxine) and similar derivatives constitute one class of useful host compounds capable of supporting electroluminescence. Illustrative of useful chelated oxinoid compounds are the following:

CO-1: Aluminum trisoxine [alias, tris(8-quinolinolato)aluminum(III)]
CO-2: Magnesium bisoxine [alias, bis(8-quinolinolato)magnesium(II)]
CO-3: Bis[benzo{f}-8-quinolinolato]zinc (II)
CO-4: Bis(2-methyl-8-quinolinolato)aluminum(III)-μ-oxo-bis(2-methyl-8-quinolinolato)aluminum(III)
CO-5: Indium trisoxine [alias, tris(8-quinolinolato)indium]
CO-6: Aluminum tris(5-methyloxine) [alias, tris(5-methyl-8-quinolinolato)aluminum(III)]
CO-7: Lithium oxine [alias, (8-quinolinolato)lithium(I)]
CO-8: Gallium oxine [alias, tris(8-quinolinolato)gallium (III)]
CO-9: Zirconium oxine [alias, tetra(8-quinolinolato)zirconium(IV)]

Other classes of useful host materials include, but are not limited to: derivatives of anthracene, such as 9,10-di-(2-naphthyl)anthracene and derivatives thereof as described in U.S. Pat. No. 5,935,721, distyrylarylene derivatives as described in U.S. Pat. No. 5,121,029, and benzazole derivatives, for example, 2,2',2"-(1,3,5-phenylene)tris[1-phenyl-1H-benzimidazole]. Carbazole derivatives are particularly useful hosts for phosphorescent emitters.

Useful fluorescent dopants include, but are not limited to, derivatives of anthracene, tetracene, xanthene, perylene, rubrene, coumarin, rhodamine, and quinacridone, dicyanomethylenepyran compounds, thiopyran compounds, polymethine compounds, pyrilium and thiapyrilium compounds, fluorene derivatives, periflanthene derivatives, indenoperylene derivatives, bis(azinyl)amine boron compounds, bis(azinyl)methane compounds, and carbostyryl compounds.

Electron-Transporting Layer (ETL)

Preferred thin film-forming materials for use in forming the electron-transporting layer 111 of the organic EL elements of this invention are metal chelated oxinoid compounds, including chelates of oxine itself (also commonly referred to as 8-quinolinol or 8-hydroxyquinoline). Such compounds help to inject and transport electrons, exhibit high levels of performance, and are readily fabricated in the form of thin films. Exemplary oxinoid compounds were listed previously.

Other electron-transporting materials include various butadiene derivatives as disclosed in U.S. Pat. No. 4,356,429 and various heterocyclic optical brighteners as described in U.S. Pat. No. 4,539,507. Benzazoles and triazines are also useful electron-transporting materials.

Cathode

When light emission is viewed solely through the anode, the cathode 113 used in this invention can be comprised of nearly any conductive material. Desirable materials have good film-forming properties to ensure good contact with the underlying organic layer, promote electron injection at low voltage, and have good stability. Useful cathode materials often contain a low work function metal (<4.0 eV) or metal alloy. One preferred cathode material is comprised of a Mg:Ag alloy wherein the percentage of silver is in the range of 1 to 20%, as described in U.S. Pat. No. 4,885,221. Another suitable class of cathode materials includes bilayers comprising a thin electron-injection layer (EIL) in contact with the organic layer (e.g., ETL) which is capped with a thicker layer of a conductive metal. Here, the EIL preferably includes a low work function metal or metal salt, and if so, the thicker capping layer does not need to have a low work function. One such cathode is comprised of a thin layer of LiF followed by a thicker layer of Al as described in U.S. Pat. No. 5,677,572. Other useful cathode material sets include, but are not limited to, those disclosed in U.S. Pat. Nos. 5,059,861; 5,059,862; and 6,140,763.

When light emission is viewed through the cathode, the cathode must be transparent or nearly transparent. For such applications, metals must be thin or one must use transparent conductive oxides, or a combination of these materials. Optically transparent cathodes have been described in more detail in U.S. Pat. No. 4,885,211, U.S. Pat. No. 5,247,190, JP 3,234,963, U.S. Pat. No. 5,703,436, U.S. Pat. No. 5,608, 287, U.S. Pat. No. 5,837,391, U.S. Pat. No. 5,677,572, U.S. Pat. No. 5,776,622, U.S. Pat. No. 5,776,623, U.S. Pat. No. 5,714,838, U.S. Pat. No. 5,969,474, U.S. Pat. No. 5,739,545, U.S. Pat. No. 5,981,306, U.S. Pat. No. 6,137,223, U.S. Pat. No. 6,140,763, U.S. Pat. No. 6,172,459, EP 1 076 368, U.S. Pat. No. 6,278,236, and U.S. Pat. No. 6,284,393. Cathode materials are typically deposited by evaporation, sputtering, or chemical vapor deposition. When needed, patterning can be achieved through many well known methods including, but not limited to, through-mask deposition, integral shadow masking, for example, as described in U.S. Pat. No. 5,276, 380 and EP 0 732 868, laser ablation, and selective chemical vapor deposition.

Other Common Organic Layers and Device Architecture

In some instances, layers 109 and 111 can optionally be collapsed into a single layer that serves the function of supporting both light emission and electron transportation. It also known in the art that emitting dopants may be added to the hole-transporting layer, which may serve as a host. Multiple dopants may be added to one or more layers in order to create a white-emitting OLED, for example, by combining blue- and yellow-emitting materials, cyan- and red-emitting materials, or red-, green-, and blue-emitting materials. White-emitting devices are described, for example, in EP 1 187 235, U.S. Ser. No. 20020025419, EP 1 182 244, U.S. Pat. No. 5,683,823, U.S. Pat. No. 5,503,910, U.S. Pat. No. 5,405,709, and U.S. Pat. No. 5,283,182.

Additional layers such as electron or hole-blocking layers as taught in the art may be employed in devices of this invention. Hole-blocking layers are commonly used to improve efficiency of phosphorescent emitter devices, for example, as in U.S. Ser. No. 20020015859.

This invention may be used in so-called stacked device architecture, for example, as taught in U.S. Pat. No. 5,703, 436 and U.S. Pat. No. 6,337,492.

Deposition of Organic Layers

The organic materials mentioned above are suitably deposited through a vapor-phase method such as sublimation, but can be deposited from a fluid, for example, from a solvent with an optional binder to improve film formation. If the material is a polymer, solvent deposition is useful but other methods can be used, such as sputtering or thermal transfer from a donor sheet. The material to be deposited by sublimation can be vaporized from a sublimator "boat" often comprised of a tantalum material, e.g., as described in U.S. Pat. No. 6,237,529, or can be first coated onto a donor sheet and then sublimed in closer proximity to the substrate. Layers with a mixture of materials can utilize separate sublimator boats or the materials can be pre-mixed and coated from a single boat or donor sheet. Patterned deposition can be achieved using shadow masks, integral shadow masks (U.S. Pat. No. 5,294,870), spatially-defined thermal dye transfer from a donor sheet (U.S. Pat. Nos. 5,688,551, 5,851,709 and 6,066,357) and inkjet method (U.S. Pat. No. 6,066,357).

Encapsulation

Most OLED devices are sensitive to moisture or oxygen, or both, so they are commonly sealed in an inert atmosphere such as nitrogen or argon, along with a desiccant such as alumina, bauxite, calcium sulfate, clays, silica gel, zeolites, alkaline metal oxides, alkaline earth metal oxides, sulfates, or metal halides and perchlorates. Methods for encapsulation and desiccation include, but are not limited to, those described in U.S. Pat. No. 6,226,890. In addition, barrier layers such as SiOx, Teflon, and alternating inorganic/polymeric layers are known in the art for encapsulation.

Optical Optimization

OLED devices of this invention can employ various well-known optical effects in order to enhance its properties if desired. This includes optimizing layer thicknesses to yield maximum light transmission, providing dielectric mirror structures, replacing reflective electrodes with light-absorbing electrodes, providing anti glare or anti-reflection coatings over the display, providing a polarizing medium over the display, or providing colored, neutral density, or color conversion filters over the display. Filters, polarizers, and anti-glare or anti-reflection coatings may be specifically provided over the cover, the touch screen or as part of the cover or a cathode protection layer beneath the cover.

The invention has been described in detail with particular reference to certain preferred embodiments thereof, but it will be understood that variations and modifications can be effected within the spirit and scope of the invention. For example, although the invention has been described with reference to a resistive wire touch screen, the invention is equally applicable to other touch screen technologies, such as surface acoustic wave, capacitive, inductive, and infra red.

| PARTS LIST | |
|---|---|
| 10 | top-emitting OLED device |
| 11 | resistive touch screen |
| 12 | OLED layer |
| 12R | red-light emitting OLED layer |
| 12G | green-light emitting OLED layer |
| 12B | blue-light emitting OLED layer |
| 13 | OLED elements |
| 14 | second electrode layer |
| 16 | first electrode layer |
| 18 | power source |
| 20 | substrate |
| 22 | TFT active matrix layer |
| 23 | drivers |
| 24 | first insulating planarization layer |
| 24' | second insulating planarization layer |
| 26 | hole-injecting layer |
| 27 | hole-transporting layer |
| 28 | electron transporting layer |
| 29 | electron injection layer |
| 32 | electrode protection layer |
| 34 | cavity |
| 36 | encapsulating cover |
| 37 | rim |
| 50 | touch screen substrate |
| 52 | resistive layer |
| 54 | spacer dot |
| 56 | sensors and conductors |
| 58 | conductive layer |
| 60 | flexible layer |
| 70 | adhesive |
| 72 | light absorber |
| 80 | ultra-violet radiation source |
| 82 | ultra-violet radiation |
| 101 | substrate |
| 103 | anode layer |
| 105 | hole-injecting layer |
| 107 | hole-transporting layer |
| 109 | light-emitting layer |
| 111 | electron-transporting layer |
| 113 | cathode layer |
| 200 | provide a substrate step |
| 202 | form an OLED step |
| 204 | provide cover step |
| 206 | form a touch screen step |
| 208 | locate step |
| 210 | cure step |
| 250 | voltage/current source |
| 260 | conductive wiring |

What is claimed is:

1. An integrated OLED display and touch screen, comprising:
   a) a substrate;
   b) a top-emitting OLED display formed on the substrate, the display including light blocking circuit elements extending to an edge of the substrate;
   c) a transparent, encapsulating cover adhered to the substrate by a light curable adhesive to hermetically encapsulate the OLED display inside the encapsulating cover; and
   d) a touch screen formed on the outside of the transparent encapsulating cover, the touch screen having light blocking circuit elements extending to a corresponding edge of the transparent encapsulating cover, wherein the light curable adhesive is located between the light blocking circuit elements of the display and the touch screen.

2. The OLED display claimed in claim 1, wherein the encapsulating cover defines a cavity over the OLED display with a rim around the cavity, the light curable adhesive adhering the rim to the substrate.

3. The OLED display claimed in claim 2, wherein the cavity contains desiccant materials.

4. The OLED display claimed in claim 1, wherein the encapsulating cover is glass.

5. The OLED display claimed in claim 1, wherein the light curable adhesive is light absorbing when cured.

6. The OLED display claimed in claim 1, wherein the touch screen is a surface acoustic wave touch screen.

7. The OLED display claimed in claim 1, wherein the touch screen is a capacitive touch screen.

8. The OLED display claimed in claim 1, wherein the touch screen is an infra red touch screen.

9. The OLED display claimed in claim 1, wherein the touch screen is an inductive touch screen.

10. The OLED display claimed in claim 1, wherein the touch screen is a four-wire resistive touch screen.

11. The OLED display claimed in claim 1, wherein the touch screen is a five-wire touch screen.

12. A method of manufacturing an integrated OLED display and touch screen, comprising the steps of:
   a) providing a substrate;
   b) forming a top-emitting OLED display on the substrate, the display including light blocking circuit elements extending to an edge of the substrate;
   c) providing a transparent encapsulating cover;
   d) forming a touch screen on a first side of the transparent encapsulating cover, the touch screen having light blocking circuit elements extending to a corresponding edge of the transparent encapsulating cover;
   e) locating the encapsulating cover over the substrate with a light curable adhesive located between the light blocking circuit elements of the display and the touch screen; and
   f) curing the light curable adhesive to hermetically encapsulate the OLED display by directing light onto the edges of the display.

13. The method claimed in claim 12, wherein the light curable adhesive is an epoxy.

14. The method claimed in claim 12, wherein the light curable adhesive is UV-curable.

15. The method claimed in claim 12, further comprising the step of masking the OLED display with a light absorbing mask during the step of curing the light curable adhesive.

16. The method claimed in claim 12, wherein the display and light source are rotated relative to each other about an axis perpendicular to the substrate to expose the edges of the display to light.

17. The method claimed in claim 16, wherein axis of rotation precesses during the relative rotation of the display with respect to the light source.

* * * * *